United States Patent
Winch et al.

(10) Patent No.: US 9,029,714 B2
(45) Date of Patent: May 12, 2015

(54) ELECTROMAGNETICALLY SHIELDED ENCLOSURE AND DOUBLE PERIMETER ENTRY SEAL

(71) Applicant: Select Fabricators, Inc., Canandaigua, NY (US)

(72) Inventors: Gary William Winch, Naples, NY (US); Brian Donald Smith, Keuka Park, NY (US)

(73) Assignee: Select Fabricators, Inc., Canandaigua, NY (US)

( * ) Notice: Subject to any disclaimer, the term of this patent is extended or adjusted under 35 U.S.C. 154(b) by 198 days.

(21) Appl. No.: 13/711,731

(22) Filed: Dec. 12, 2012

(65) Prior Publication Data

US 2014/0020946 A1    Jan. 23, 2014

Related U.S. Application Data

(60) Provisional application No. 61/577,570, filed on Dec. 19, 2011.

(51) Int. Cl.
*H05K 9/00*          (2006.01)
(52) U.S. Cl.
CPC ............ *H05K 9/0015* (2013.01); *H05K 9/0001* (2013.01)
(58) Field of Classification Search
CPC ................................ H05K 9/0015; H05K 9/00
USPC .................. 174/353, 377, 382; 361/816, 818; 52/79.1
See application file for complete search history.

(56) References Cited

U.S. PATENT DOCUMENTS

| | | | | | |
|---|---|---|---|---|---|
| 3,969,572 | A | * | 7/1976 | Rostek | 174/353 |
| 4,525,904 | A | * | 7/1985 | Petri | 24/458 |
| 4,785,136 | A | * | 11/1988 | Mollet et al. | 174/363 |
| 5,164,543 | A | * | 11/1992 | Benson et al. | 174/363 |
| 5,545,844 | A | * | 8/1996 | Plummer et al. | 174/379 |
| 5,908,043 | A | | 6/1999 | Paes et al. | |
| 6,011,504 | A | * | 1/2000 | Tan | 342/4 |
| 6,068,009 | A | * | 5/2000 | Paes et al. | 135/117 |
| 6,111,192 | A | * | 8/2000 | Bell et al. | 174/384 |
| 6,170,203 | B1 | * | 1/2001 | Schlapfer | 52/173.1 |
| 6,303,854 | B1 | * | 10/2001 | Papaleo et al. | 174/382 |
| 6,952,844 | B2 | * | 10/2005 | Danaher | 5/414 |
| 7,046,521 | B2 | * | 5/2006 | Garmong | 361/799 |
| 7,287,305 | B2 | * | 10/2007 | Bednarski | 24/297 |
| 7,663,066 | B2 | * | 2/2010 | Tyson et al. | 174/372 |
| 8,530,756 | B1 | * | 9/2013 | Winch | 174/382 |

(Continued)

*Primary Examiner* — Jinhee Lee
*Assistant Examiner* — Rashen E Morrison
(74) *Attorney, Agent, or Firm* — Patent Technologies, LLC; Robert D. Gunderman, Jr.

(57) ABSTRACT

An electromagnetically shielded enclosure that is portable and lightweight with a double perimeter entry seal. The electromagnetically shielded enclosure can be used for applications such as testing and security and can be scaled from a bench top unit to a large field deployed enclosure. The electromagnetically shielded enclosure has a novel entry seal that eliminates the electromagnetic leakage that is common around the entry areas of such enclosures. The entry seal of the electromagnetically shielded enclosure is made up of a door having a first perimeter closure material and a second perimeter closure material and an enclosure opening having a first perimeter closure and a second perimeter closure where the first perimeter closure material aligns with the first perimeter closure and the second perimeter closure material aligns with the second perimeter closure. This double perimeter entry seal provides for electromagnetic isolation within the electromagnetically shielded enclosure.

20 Claims, 10 Drawing Sheets

(56) References Cited

U.S. PATENT DOCUMENTS

| | | | |
|---|---|---|---|
| 2002/0121386 A1* | 9/2002 | Traut et al. | 174/35 R |
| 2004/0250483 A1* | 12/2004 | Zheng | 52/79.5 |
| 2005/0061526 A1* | 3/2005 | Hensley et al. | 174/35 GC |
| 2005/0274406 A1* | 12/2005 | Danaher | 135/126 |
| 2007/0002547 A1* | 1/2007 | Garmong | 361/752 |
| 2008/0257598 A1 | 10/2008 | Tyson et al. | |
| 2010/0043855 A1* | 2/2010 | Rothweil | 135/135 |
| 2014/0020946 A1* | 1/2014 | Winch et al. | 174/353 |

* cited by examiner ures portable. Lightweight, rapidly deplorable, temporary,

ELECTROMAGNETICALLY SHIELDED ENCLOSURE AND DOUBLE PERIMETER ENTRY SEAL

CROSS REFERENCE TO RELATED PATENT APPLICATIONS

This application claims priority to U.S. Patent Application Ser. No. 61/577,570 filed Dec. 19, 2011 entitled "Electromagnetically Shielded Enclosure And Double Perimeter Entry Seal" by Gary William Winch of Naples, N.Y. and Brian Donald Smith of Keuka Park, N.Y., the entire disclosure of which is incorporated herein by reference.

BACKGROUND OF THE INVENTION

1. Field of the Invention

This invention relates generally to electromagnetic shielding, and more specifically to an electromagnetically shielded enclosure having a double perimeter entry seal.

2. Description of Related Art

As the proliferation of radiofrequency generating devices continues at a rapid pace, there is an ongoing and growing need to shield from unwanted electromagnetic radiation for various purposes. For example, certain electronic equipment requires an electromagnetically "quiet" environment to function properly. Such equipment includes, for example, some medical diagnostic and imaging equipment. In addition, testing of electronic equipment often requires a similar electromagnetically "quiet" environment.

In some situations, there is also the need to prevent radiofrequencies from leaving a confined physical area. Such situations include, for example, the use of computer and military electronics where there is the risk of unwanted detection, of a radiated radiofrequency signal or unwanted detection, of the associated harmonics and signature of radiofrequency activity.

Further, testing such as EMI/EMC testing requires the monitoring of electromagnetic energy released from a device under test in a controlled environment where there are little or no outside sources of electromagnetic radiation that could interfere with the monitoring of the device under test. Such testing may also include subjecting a device under test to external electromagnetic energy and monitoring the impact of this external electromagnetic energy on the proper functioning of the device under test.

With the various requirements for electromagnetically shielded enclosures, there exists a need to make these enclosures portable. Lightweight, rapidly deplorable, temporary, and relatively low cost. With the advent of metalized fabrics and textiles, shielded tents and portable enclosures are available today. These enclosures are essentially a Faraday Cage where electromagnetic signals should not pass. Such enclosures come in many shapes and sizes, and are available from various manufacturers. While such enclosures are available, their shielding effectiveness may not always be adequate due to radiofrequency leakage at seams and ingress/egress points such as doors. As such, the overall construction of a portable electromagnetically shielded, enclosure is a vital part of the performance of the shielded enclosure.

The shielding effectiveness of a portable electromagnetic enclosure is controlled by several variables, including the type of metalized fabric used and the overall construct of the portable electromagnetic enclosure. Stitching, fasteners, ventilation, and ingress/egress panels all must be properly designed to limit the amount of electromagnetic leakage. Most portable electromagnetic enclosures have an ingress/egress section such as a door or removable panel. Such doors and panels are prone to electromagnetic leakage, particularly where the door or panel meets the side of the electromagnetic enclosure.

It is thus an object of the present invention to provide an electromagnetic enclosure that is portable, lightweight, rapidly deployable, temporary, and relatively low cost. It is another object of the present invention to provide an electromagnetic enclosure with an entry seal that is not prone to electromagnetic leakage, it is another object of the present invention to provide an entry seal for an electromagnetic enclosure that has a double perimeter seal that is not prone to electromagnetic leakage. It is another object of the present invention to provide an electromagnetic enclosure that is portable and easily adjustable.

BRIEF SUMMARY OF THE INVENTION

In accordance with the present invention, there is provided an electromagnetically shielded enclosure having an entry seal where the entry seal comprises a door having a first perimeter closure material and a second perimeter closure material and an enclosure opening having a first perimeter closure and a second perimeter closure where the first perimeter closure material aligns with the first perimeter closure and the second perimeter closure material aligns with the second, perimeter closure to provide for electromagnetic isolation within the electromagnetically shielded enclosure.

The foregoing paragraph has been provided by way of introduction, and is not intended to limit the scope of the invention as described in this specification, claims, and the attached drawings.

BRIEF DESCRIPTION OF THE DRAWINGS

The invention will be described by reference to the following drawings, in which like numerals refer to like elements, and in which.

Figure 1:
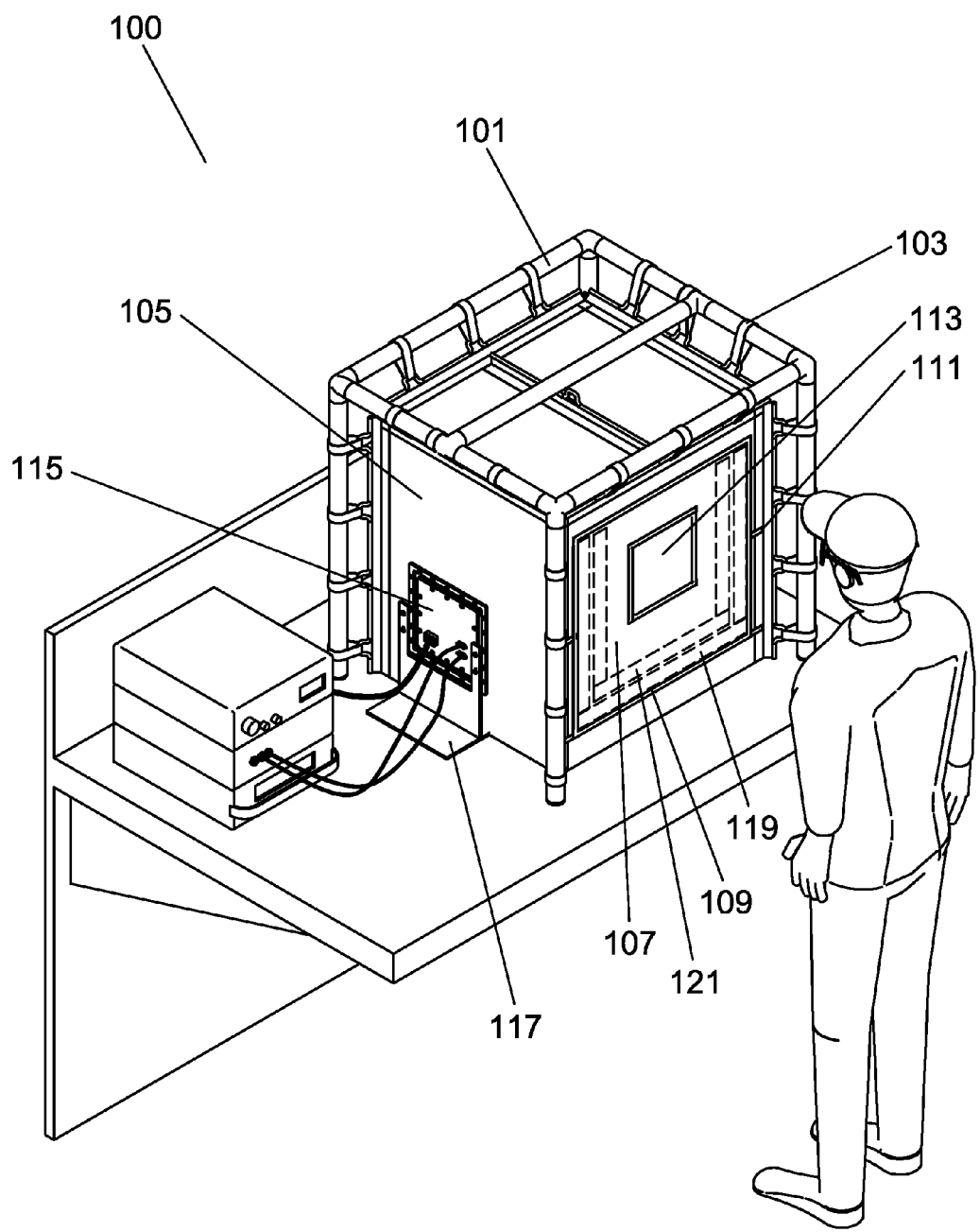
FIG. 1 is a perspective view of an electromagnetically shielded enclosure and double perimeter entry seal in use.

The present invention will be described in connection with a preferred embodiment however, it will be understood that there is no intent to limit the invention to the embodiment described. On the contrary, the intent is to cover all alternatives, modifications, and equivalents as may be included within the spirit and scope of the invention as defined by this specification, claims, and the attached drawings.

DESCRIPTION OF THE PREFERRED EMBODIMENTS

There are various techniques for the design and construction of an electromagnetically shielded enclosure. The shape, size and materials selected for an electromagnetically shielded enclosure may vary based on the intended application. The present invention and the various embodiments depicted and envisioned herein do not rely on specific geometries, materials, or structural designs, but rather, the entry seal of the present invention may be adapted and modified to fit a wide range of electromagnetically shielded enclosures. Such adaptations and modifications will become evident to one skilled in the art after reading this specification and claims, and viewing the attached drawings.

For a general understanding of the present invention, reference is made to the drawings. In the drawings, like reference numerals have been used throughout to designate identical elements.

FIG. 1 is a perspective view of an electromagnetically shielded enclosure and double perimeter entry seal in use. The electromagnetically shielded enclosure 100 depicted in FIG. 1 uses a frame 101 for support; such external frames are readily available in various configurations by various manufacturers. An example of a manufacturer of frames is Rose and Krieger of Frederick, Md. Frames may be made from aluminum, fiberglass, or other suitable structurally sufficient material. Various manufacturers and frame designs may be used without departing from the spirit and scope of the present invention and its various embodiments depicted, described, illustrated or envisioned herein. The entry seal of the present invention may also be used with an electromagnetically shielded enclosure that is frameless, or uses an internal frame, an inflatable structure, or the like.

The electromagnetically shielded enclosure 100 includes a novel magnetic sealing arrangement that provides for electromagnetic shielding and reduces the electromagnetic "leaks" common in the door and entry areas of many electromagnetically shielded enclosures. The electromagnetically shielded enclosure 100 has an entry seal where the entry seal comprises a door having a first perimeter closure material and a second perimeter closure material and an enclosure opening having a first perimeter closure and a second perimeter closure where the first perimeter closure material aligns with the first perimeter closure and the second perimeter closure material aligns with the second perimeter closure to provide for electromagnetic isolation within the electromagnetically shielded enclosure. The closure material may be a conductive hook and loop fastening material, a rigid flap, a weight strip, conductive foam, a radiofrequency absorber material, a conductive zipper, a magnet, a magnetic strip, or the like. In one preferred embodiment of the present invention, the electromagnetically shielded enclosure 100 has an entry seal where the entry seal comprises a door having a first perimeter door magnet and a second perimeter door magnet and an enclosure opening having a first perimeter enclosure magnet and a second perimeter enclosure magnet where the first perimeter door magnet aligns with the first perimeter enclosure magnet and the second perimeter door magnet aligns with the second perimeter enclosure magnet to provide for electromagnetic isolation within the electromagnetically shielded enclosure. The manufacture and use of the entry seal of the present invention and its various embodiments will become evident upon further review of this specification, claims and drawings.

The electromagnetically shielded enclosure 100, as depicted in FIG. 1, is supported by the frame 101 by way of retaining straps 103, bungee cords, quick release buckles and fasteners, or similar retention devices. These retention devices are commonly made from nylon, polyester, and the like and may include additional hardware. The electromagnetically shielded enclosure 100 has sides 105, as well as top and bottom, that are made from a conductive material such as, for example, a metalized woven textile, a mesh, a metal, a non-woven textile or metal, and the like. Other materials may also be included in the electromagnetically shielded enclosure. In addition, the materials may be layered or compositely structured to accomplish additional shielding effectiveness, weather resistance, structural, integrity, and the like. An example of such a metalized woven textile is a silver plated woven nylon ripstop fabric sold under the tradename ProTex Ag by Carolina Silver Technologies of Maiden, N.C. In some embodiments of the present invention, the fabric may be fire retardant or be treated with a fire retardant coating or impregnation. An example of a flame retardant coating is a dispersion of halogenated hydrocarbons and antimony, such as, for example, APEX BACKOTE #7245 by Apexical, Inc. of Spartanburg, S.C. Other coatings, such as waterproofing or weatherproofing coatings may also be applied in some embodiments of the present invention. The electromagnetically shielded enclosure 100 has a door assembly that reduces or eliminates electromagnetic leakage around the entry area. Shown in FIG. 1 is a door 107 that is made from a conductive material such as a metalized woven textile, and may, in some embodiments of the present invention, be the same material used for the sides of the enclosure 100. The door 107 has an edge 109 that may be attached along one side of the door to the enclosure body by way of stitching, fasteners, or being a piece of material continuous between the door and the enclosure body. The door 107 may, in some embodiments of the present invention, be detachable. The door 107 is depicted with a threshold below it to facilitate proper electromagnetic sealing. The height, of the threshold may vary. The threshold may further be removable or detachable to allow for ease of passage through the entryway. In some embodiments of the present invention, the threshold may be eliminated or replaced by a suitable retention structure such as a flap or the like. The electromagnetically shielded enclosure 100 may also have an outer protective covering; the protective covering, for example, may cover the bottom of the enclosure, and may be made from, for example, reinforced vinyl. Other parts of the electromagnetically shielded enclosure may also have an outer protective covering for various purposes, such as, for example, increased water resistance, ultraviolet protection, and the like.

Figure 6:
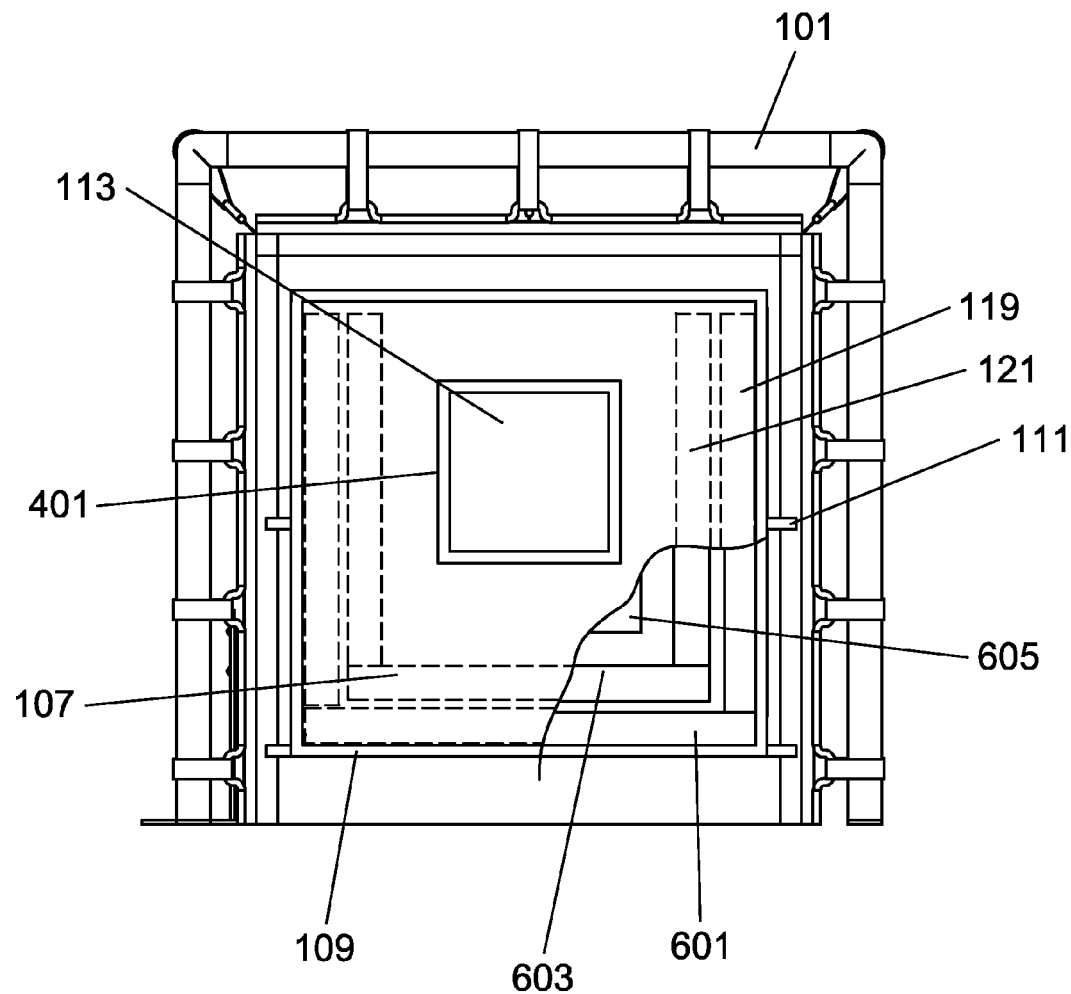
FIG. 6 is a partially cutaway view of an entry side of an electromagnetically shielded enclosure and double perimeter entry seal.

The door 107 may also have an alignment loop 111 or a series of alignment loops to facilitate opening and closing the door. The alignment loop 111 may be made from a material such as, for example, a woven nylon or polyester strap. The alignment loop 111 may also have a similar structure on the enclosure body to facilitate proper alignment of the door with the opening. Proper alignment of the door with the opening allows for proper shielding such that the enclosure maintains electromagnetic shielding in use. The door 107 may also have a viewing window 113 to allow for the viewing of electronic devices under test or operation within the enclosure. The window 113 may be made from a fine metal mesh that may also, in some embodiments of the present invention, be sandwiched between one or more pieces of transparent material such as vinyl or the like. In some embodiments of the present invention, the window 113 may be made from a woven or a non-woven metal or metalized fabric or cording, and may for example be made from a fabric suitable for shielding such as a metalized fabric. An example of a suitable moralized fabric is the silver plated nylon warp knitted fabric manufactured by Carolina Silver Technologies, LLC of Valdese, N.C. and sold as Salem Antibacterial Fabric under style number 53951348. The window 113 may also, in some embodiments of the present invention, be placed in a side of the electromagnetically shielded enclosure. The window 113 may also have a suitable radiofrequency seal such as that which will be described further by way of FIG. 4. In one embodiment of the present invention, the entry seal of the electromagnetically shielded enclosure uses magnets to facilitate proper shielding. The door 107 has a first perimeter door magnet 119 and a second perimeter door magnet 121 where each of the perimeter magnets are fastened to the door 107 with stitching, adhesive, fasteners, or the like. Magnets used in the construction of the entry seal are preferably long strips of magnetic material that can be easily sewn, encased in fabric or other material, or otherwise fastened to the perimeter of each entry and door. An example of such a magnet is the Reance SF™ Neodymium Iron Boron magnet manufactured by The Electrodyne Company of Batavia, Ohio, and further disclosed in U.S. Pat. No. 6,707,361, the entire disclosure of which is incorporated herein by reference. Magnets may also be reinforced with material such as, for example, an adhesive foam or fabric, to increase their durability. Not shown in FIG. 1, but visible in the cutaway view of FIG. 6, are two perimeter enclosure magnets that are fastened to the perimeter of the enclosure opening such that they align with the perimeter door magnets, creating a radiofrequency shielded seal in use. The first perimeter enclosure magnet 601 and the second perimeter enclosure magnet 603 are preferably long strips of magnetic material that can be easily sewn, encased in fabric or other material or otherwise fastened to the perimeter of each entry and door. An example of such a magnet is the Reance SF™ Neodymium Iron Boron magnet manufactured by The Electrodyne Company of Batavia, Ohio, and further disclosed in U.S. Pat. No. 6,707,361, the entire disclosure of which is incorporated herein by reference. The first perimeter enclosure magnet 601 and the second perimeter enclosure magnet 603 are stitched to the enclosure, or otherwise adhered to the fabric of the enclosure using an adhesive, fasteners, or the like.

In using the electromagnetically shielded enclosure 100, an electronic device may be placed within the electromagnetically shielded enclosure. In some uses, the electronic device may be connected by way of cables that pass from the shielded environment inside the electromagnetically shielded enclosure to the outside environment. In such uses, a feedthrough 115 can be seen that is a metal plate ohmically connected to the side 105 of the enclosure. The feedthrough 115 contains connectors that pass through the metal plate to allow the electronic device within the electromagnetically shielded enclosure to be connected to equipment in the outside environment. In some embodiments of the present invention, a support 117 is mechanically connected to the feedthrough 115 to alleviate weight related problems such as fabric tearing, or the like. The support may be, for example, a horizontally oriented plate that is attached to the feedthrough 115 at a generally right angle toward the bottom of the feedthrough 115. Further, in some embodiments of the present invention, a feedthrough is not present.

Figure 2:
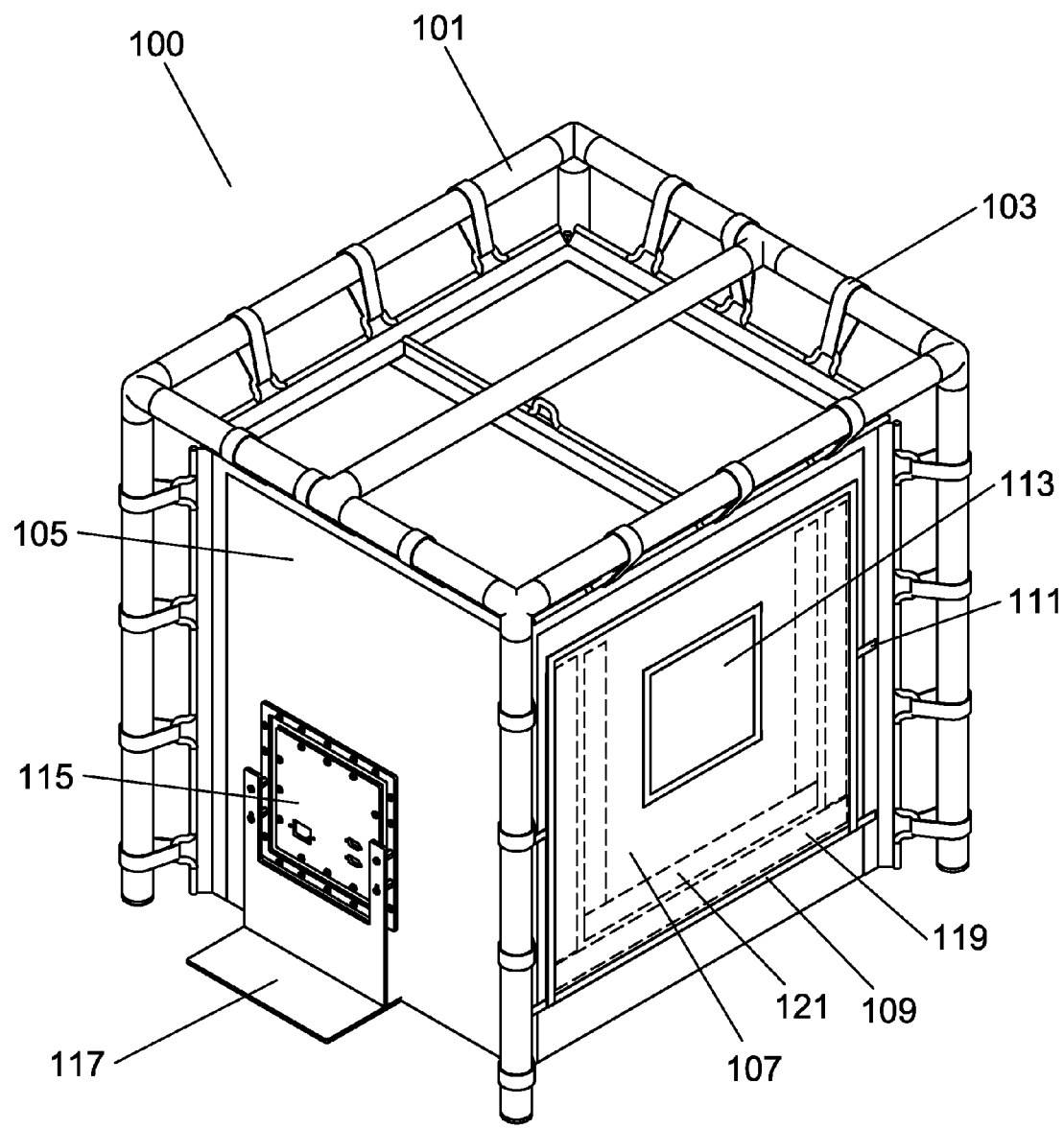
FIG. 2 is a perspective view of an electromagnetically shielded enclosure and double perimeter entry seal.

Now turning to FIG. 2, a perspective view of an electromagnetically shielded enclosure and double perimeter entry seal is depicted. As in FIG. 1, the enclosure is depicted in the closed position. The door 107 can be seen, aligned with the enclosure body using alignment loops 111 that are present in some embodiments of the present invention on both the door and the enclosure body to ensure that the door is properly closed and electromagnetically and mechanically sealed through alignment and closure of the first perimeter door magnet 119 with the first perimeter enclosure magnet 601 (see FIG. 6) and corresponding alignment and closure of the second perimeter door magnet 121 with the second perimeter enclosure magnet 603. The door 107 may roll inward or outward or merely be moved clear of the opening during use. In some embodiments of the present invention, the door 107 may be detached from the enclosure, and may employ a similar double perimeter seal using magnets or other conductive closure material. In FIG. 2 the feedthrough 115 can be seen without cables and related connectors installed. The connectors depicted are exemplary, and not limiting. As one skilled in the art will appreciate and understand, the feedthrough 115 may contain a variety of connector, filters, and related hardware depending upon, the specific application of the enclosure. Various connectors and related hardware may be placed in the feedthrough by way of stamping, drilling, machining or otherwise creating an appropriate sized opening for the connector or related hardware to fit. Although the figures depict a window 113, the electromagnetically shielded enclosure 100 may, in some embodiments, contain a window of a different size, shape, geometry, placement, or overall construction. The electromagnetically shielded enclosure 100 may also have no window in some embodiments. For clarity, stitching or other fastening techniques and materials are not shown in the drawings, but the placement, of such fasteners or stitches will be clear to one skilled in the art after reviewing this specification with the attached drawings.

Figure 3:
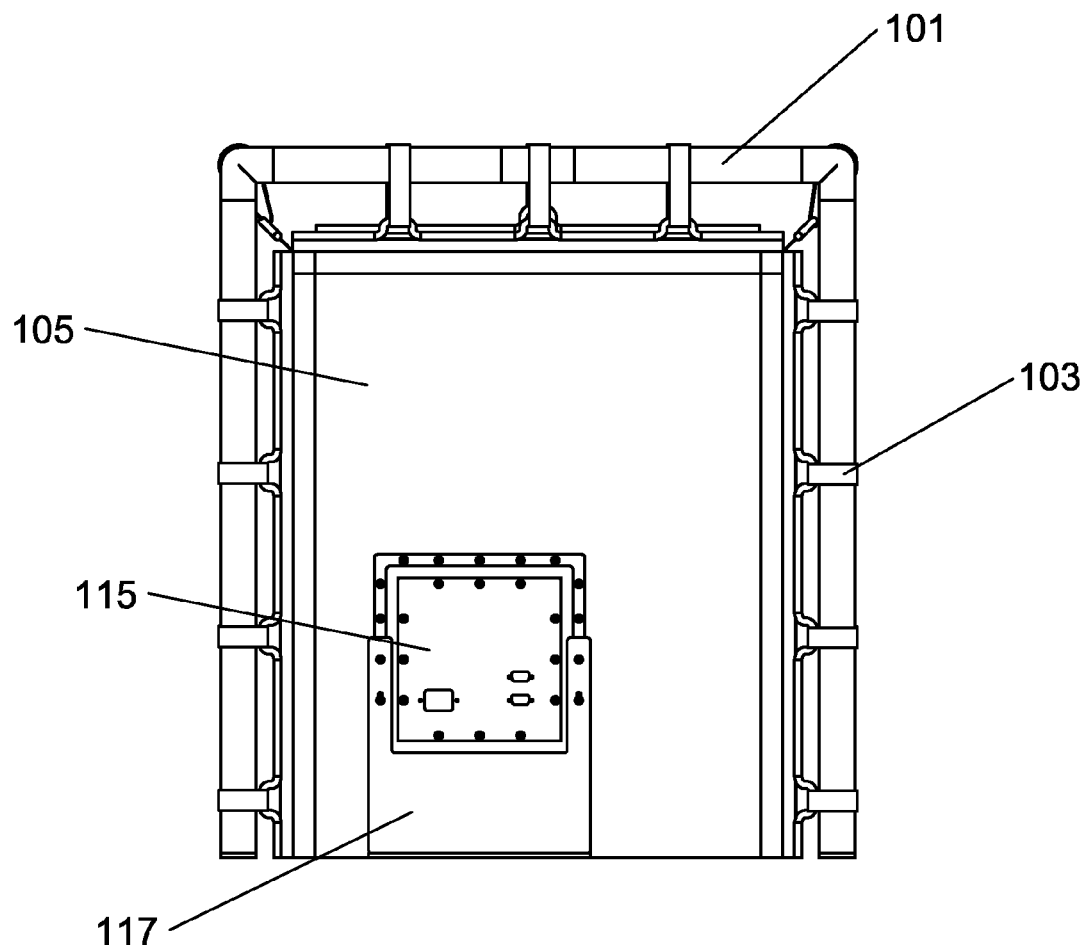
FIG. 3 is a plan view of a feedthrough side of an electromagnetically shielded enclosure of the present invention.

FIG. 3 is a plan view of a feedthrough side of an electromagnetically shielded enclosure of the present invention. The feedthrough 115 can be clearly seen with an exemplary set of connectors and related hardware. Other connectors and hardware may be used as dictated by the application of the electromagnetically shielded enclosure. A support 117 may also be seen in FIG. 3 that transfers weight from the feedthrough, connectors and related cables to a surface that, the enclosure is placed upon. The support 117 may have a bend, feet or related supports to ensure stability. The support 117 may be made from a metal such as aluminum, steel, brass, or the like. The support 117 may also be made from a plastic such as polypropylene, polyethylene, or fiberglass, or the like. Other sides of the electromagnetically shielded enclosure are similar in construction but may not have a feedthrough or support, but in some embodiments of the present invention may have additional features such as radiofrequency shielded viewing windows, access panels, feedthroughs, and the like.

Figure 4:
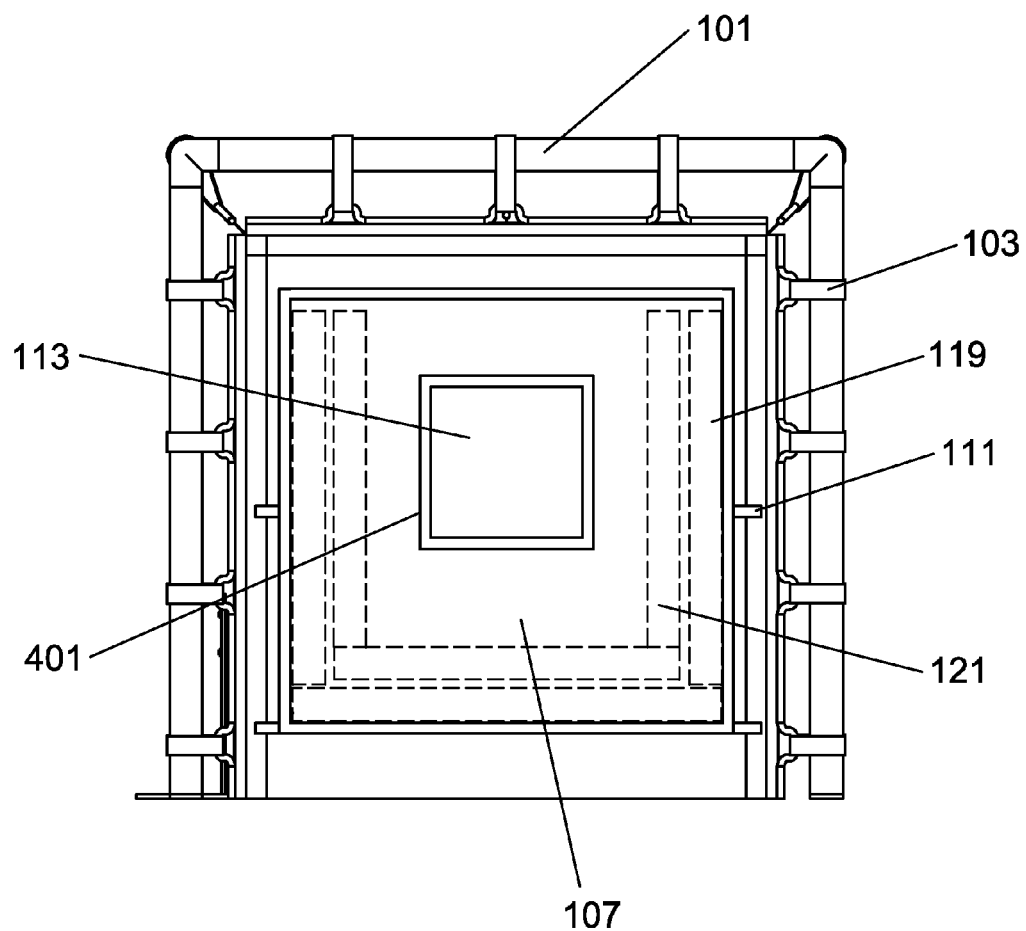
FIG. 4 is a plan view of an entry side of an electromagnetically shielded enclosure and double perimeter entry seal.

FIG. 4 is a plan view of an entry side of an electromagnetically shielded enclosure and double perimeter entry seal. The door 107 can be seen with a window 113. The door in some embodiments is made from the same or a similar material as the enclosure body. The door 107 may be made from a conductive material such as, for example, a metalized woven textile, a mesh, a metal, and the like. Other materials may also be included in the door 107, such as a metal or metalized fabric mesh for the window 113. A suitable metalized fabric is the silver plated nylon warp knitted fabric manufactured by Carolina Silver Technologies, LLC of Valdese, N.C. and sold as Salem Antibacterial Fabric under style number 53951348. In addition, the materials may be layered or compositely structured to accomplish additional shielding effectiveness, weather resistance, structural integrity, and the like. An example of such a metalized woven textile is a silver plated woven nylon ripstop fabric sold under the tradename ProTex Ag by Carolina Silver Technologies of Maiden, N.C. In some embodiments of the present invention, the fabric may be fire retardant or be treated with a fire retardant coating or impregnation. An example of a flame retardant coating is a dispersion of halogenated hydrocarbons and antimony, such as, for example, APEX BACKOTE #7245 by Apexical, Inc. of Spartanburg, S.C. Other coatings, such as waterproofing or weatherproofing coatings may also be applied in some embodiments of the present invention.

Figure 5:
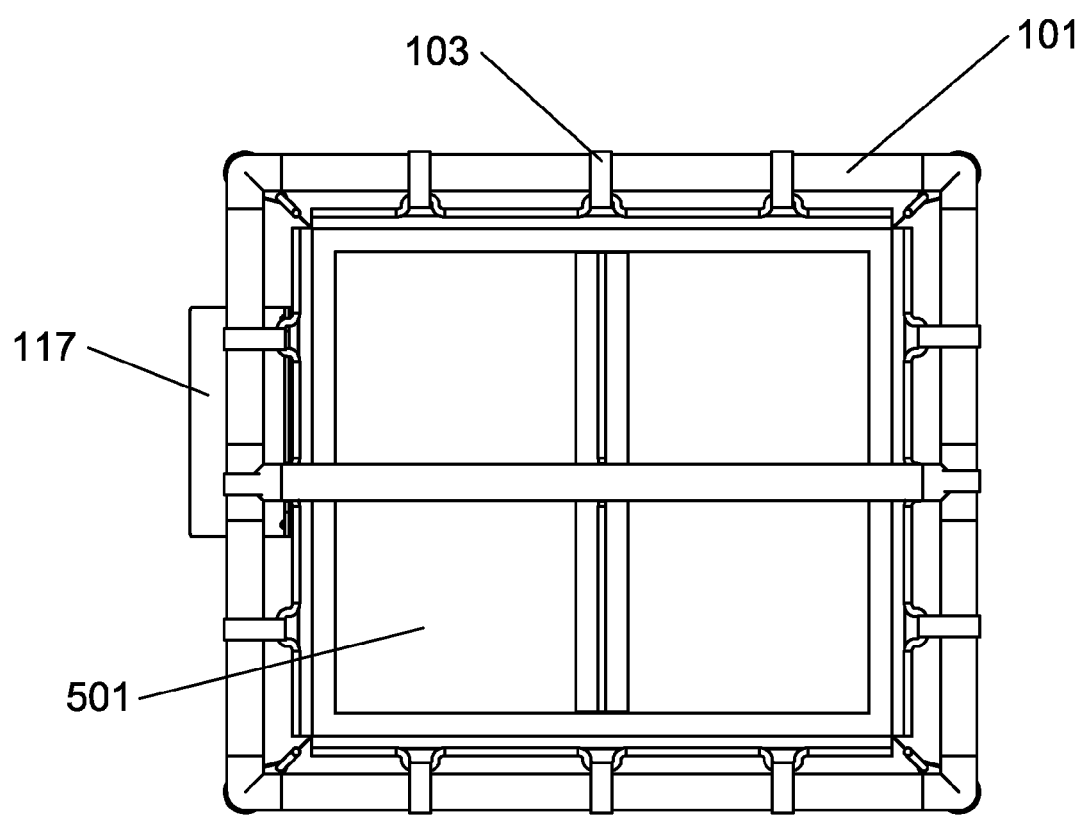
FIG. 5 is a top plan view of an electromagnetically shielded enclosure of the present invention.

FIG. 5 is a top plan view of an electromagnetically shielded enclosure of the present invention where the enclosure top 501 can be seen along with a frame 101 and related retaining straps 103. The enclosure top 501 is also made from a conductive material such as, for example, a metalized woven textile, a mesh, a metal, a non-woven textile or metal, and the like, similar to that of the sides of the electromagnetically shielded enclosure. In addition, the materials may be layered or compositely structured to accomplish additional shielding effectiveness, weather resistance, structural integrity, and the like. An example of such a metalized woven textile is a silver plated woven nylon ripstop fabric sold, under the tradename ProTex Ag by Carolina Silver Technologies of Maiden, N.C. In some embodiments of the present invention, the fabric may be fire retardant or be treated with a fire retardant coating or impregnation. An example of a flame retardant coating is a dispersion of halogenated hydrocarbons and antimony, such as, for example, APEX BACKOTE #7245 by Apexical, Inc. of Spartanburg, S.C. Other coatings, such as waterproofing or weatherproofing coatings may also be applied in some embodiments of the present invention.

To further understand the entry seal, of the present invention, FIG. 6 depicts a partially cutaway view of an entry side of an electromagnetically shielded enclosure and double perimeter entry seal. The door 107 can be seen cutaway, revealing the enclosure opening 605. The perimeter of the enclosure opening 605 contains closure material such as, for example, magnetic material to facilitate an electromagnetically tight seal. In the example depicted by way of FIG. 6, a first perimeter enclosure magnet 601 and a second perimeter enclosure magnet 603 can be seen. The strips of magnetic material that comprise the first perimeter enclosure magnet 601 and the second perimeter enclosure magnet 603 are sewn into the enclosure or otherwise fastened or encased thereupon. Various width magnetic strips and respective spacings may be used as well without departing from the spirit and scope of the present invention. The door 107, as previously described, contains magnetic material on the perimeter of the door. The strips of magnetic material are sewn proximate the edge of the door or otherwise fastened or encased thereupon. The door 107 can be seen with a first perimeter door magnet 119 and a second perimeter door magnet 121. Various width magnetic strips and respective spacings may be used as well without departing from the spirit and scope of the present invention. The magnetic perimeter door magnets, in use, mate with the magnetic perimeter enclosure magnets, where the first perimeter door magnet 119 mates with the first perimeter enclosure magnet and the second perimeter door magnet mates with the second perimeter enclosure magnet, thus forming an electromagnetically tight seal. The first perimeter door magnet 119 is placed along an outer perimeter of the door 107 with respect to the second perimeter door magnet 121. The second perimeter door magnet 121 is thus placed along an inner perimeter of the door 107 with respect to the first perimeter door magnet 119. In one embodiment of the present invention, the first perimeter door magnet 119 and the second perimeter door magnet 121 are generally parallel to each other. In a similar manner, the first perimeter enclosure magnet 601 is placed along an outer perimeter of the enclosure opening 605 with respect to the second perimeter enclosure magnet 603. The second perimeter enclosure magnet 603 is thus placed along an inner perimeter of the enclosure opening 605 with respect to the first perimeter enclosure magnet 601. In one embodiment, of the present invention, the first perimeter enclosure magnet 601 and the second perimeter enclosure magnet 603 are generally parallel to each other. The door 107 and the corresponding enclosure opening 605 also may, in some embodiments of the present invention, comprise a bias to ensure that the edge of the metalized fabric is not exposed in a way that would allow it to unravel or otherwise deteriorate with use.

Figure 7:
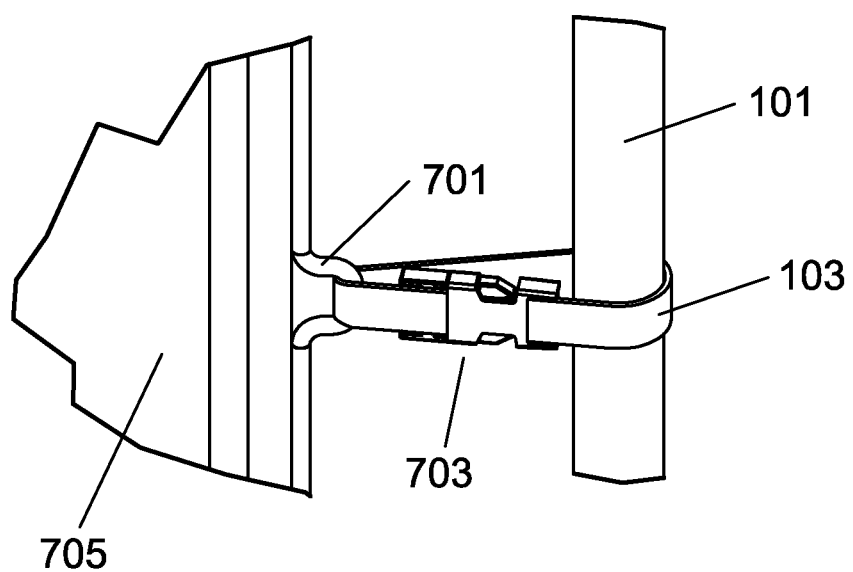
FIG. 7 is a close-up view of the enclosure to frame retention assembly.
Figure 8:
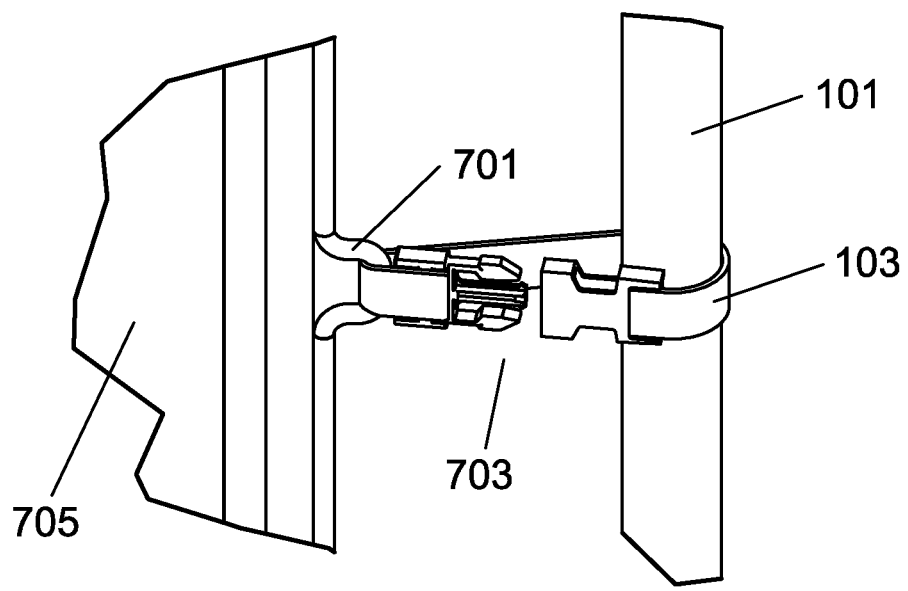
FIG. 8 is a close-up view of the enclosure to frame retention assembly with a quick release buckle in the open position.

Turning to FIGS. 7 and 8, a close-up view of the enclosure to frame retention assembly with a quick release buckle in the closed and open position respectively, is shown. As previously depicted in FIG. 1 and previously described herein, a portion of the enclosure 705 may be stitched in such as way that a cord retainer 701 travels along and is retained by the enclosure portion 705. The cord retainer 701 may be a rope such as woven polypropylene, nylon, or a metal or synthetic stranded or single strand cord. As can be seen in FIG. 7, the cord 701 protrudes from the material to allow a retaining strap 103 to be placed through the protruding cord and also placed around the frame 101 as shown in FIGS. 7 and 8 and in a way that allows the enclosure to be retained and held up by the frame 101. Should the enclosure be frameless, an internal frame, inflatable, or otherwise not require the frame 101, this enclosure to frame retention assembly may be omitted or modified. This enclosure to frame retention assembly may also be used with portable enclosures that are not RF shielded enclosures. Other techniques for fastening the enclosure to a supporting frame include grommets, hook and loop fasteners, snaps, ties, cords, wires, and the like.

Figure 9:
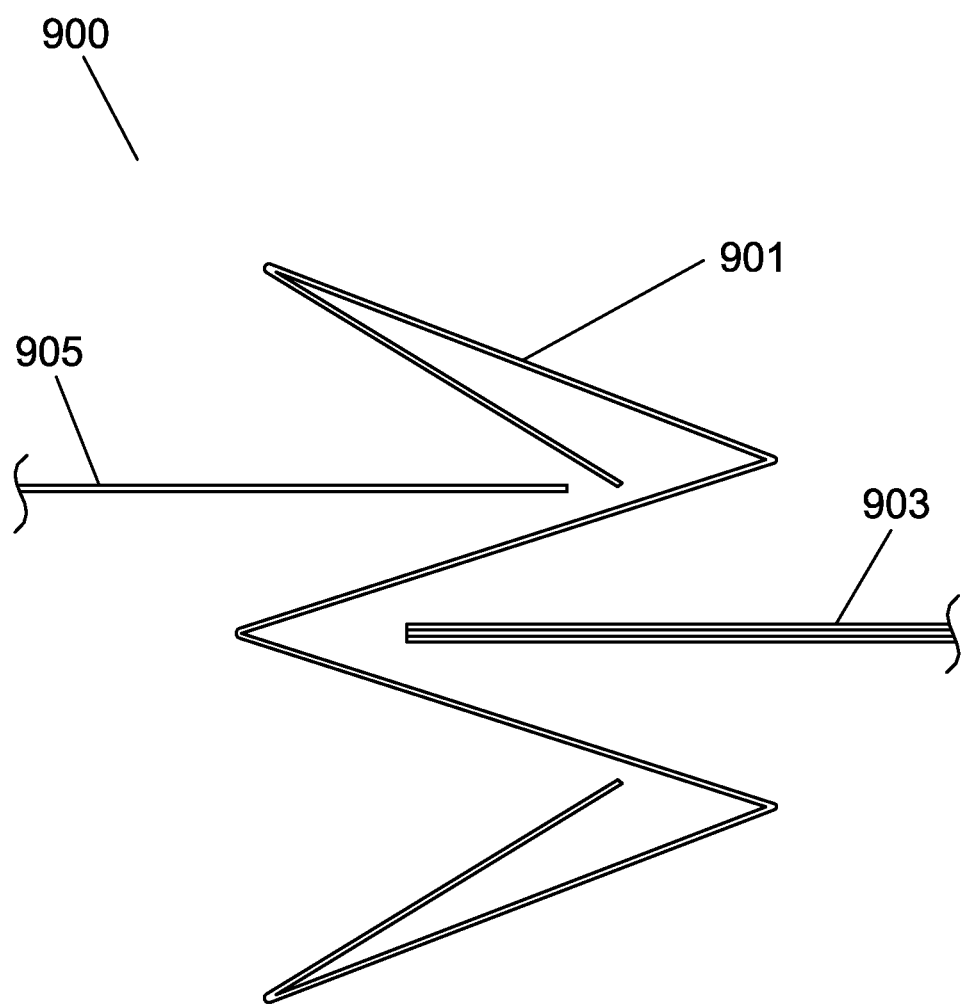
FIG. 9 is a cross sectional view of the fabric construction for the window seal of the electromagnetically shielded enclosure.
Figure 10:
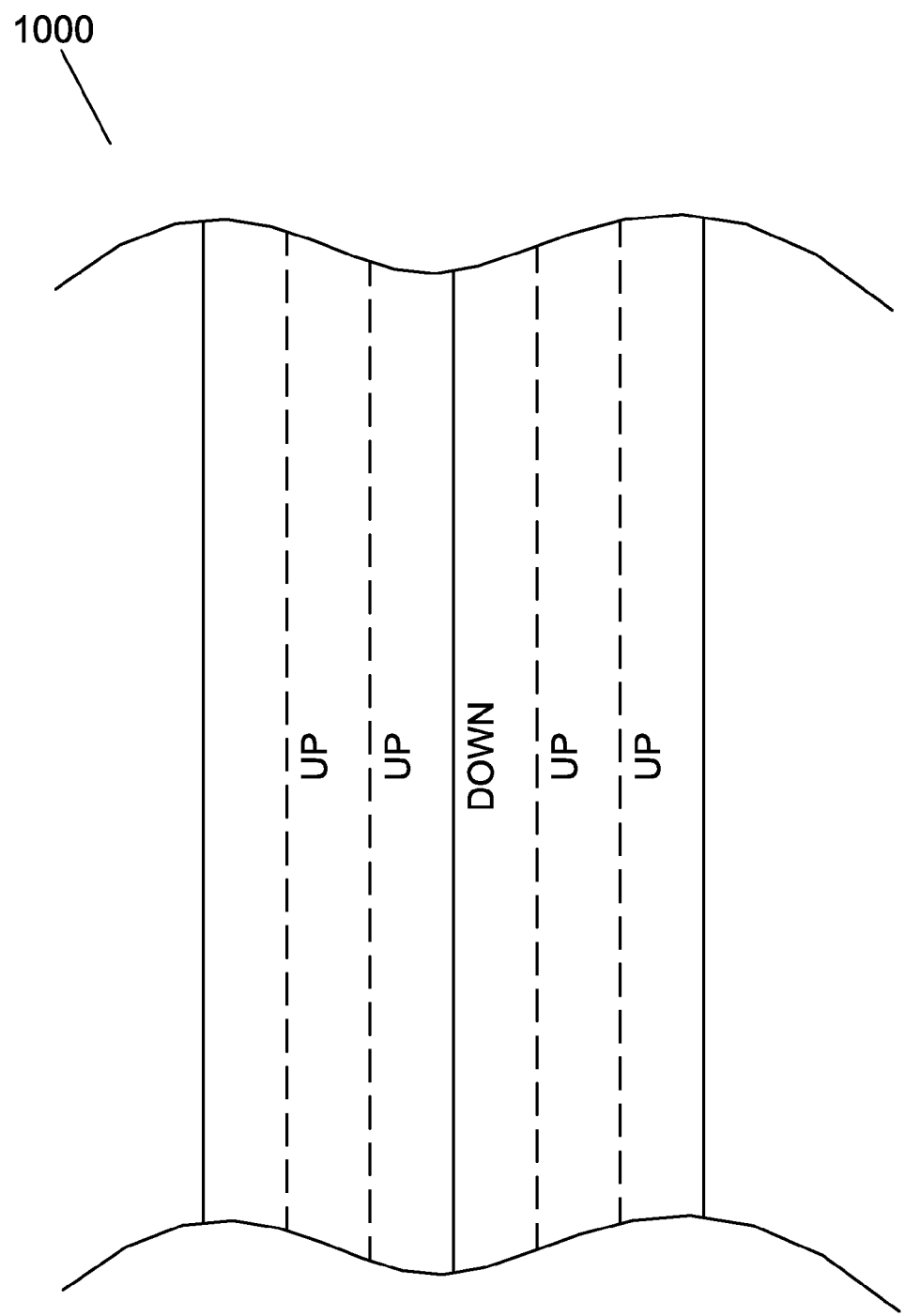
FIG. 10 is a fabric fold diagram of the accordion bias depicted in FIG. 9.

Throughout the construction of the electromagnetically shielded enclosure and double perimeter entry seal, various techniques may be used to fasten the conductive pieces, sides, top and bottom together. Such techniques may include stitching, gluing, heat bonding, and the like. One exemplary construction technique for fastening, for example, an electromagnetically shielded window to the door of the present invention, can be seen in FIG. 9 where an exemplary window seal construction 900 can be seen. The conductive material is folded into an accordion bias 901. The conductive material may be, for example, a metalized woven textile, a mesh, a metal, and the like, similar to that of the sides of the electromagnetically shielded enclosure. In addition, the materials may be layered or compositely structured to accomplish additional shielding effectiveness, weather resistance, structural integrity, and the like. An example of such a metalized woven textile is a silver plated woven nylon ripstop fabric sold under the tradename ProTex Ag by Carolina Silver Technologies of Maiden, N.C., in some embodiments of the present invention, the fabric may be fire retardant or be treated with a tire retardant coating or impregnation. An example of a flame retardant coating is a dispersion of halogenated hydrocarbons and antimony, such as, for example, APEX BACKOTE #7245 by Apexical, Inc. of Spartanburg, S.C. Other coatings, such as waterproofing or weatherproofing coatings may also be applied in some embodiments of the present invention. The accordion bias 901 surrounds the window material 903 and the enclosure material 905. The window material 903 may be a conductive mesh or a similar material that provides electromagnetic shielding as well as transparency. The enclosure material 905 may be a material such as the material used for the accordion bias 901 and previously described herein. FIG. 10 is a fabric fold diagram of the accordion bias depicted in FIG. 9. The folds can be clearly seen along with their orientation in the accordion bias fold diagram 1000 that is shown in FIG. 10.

Figure 11:
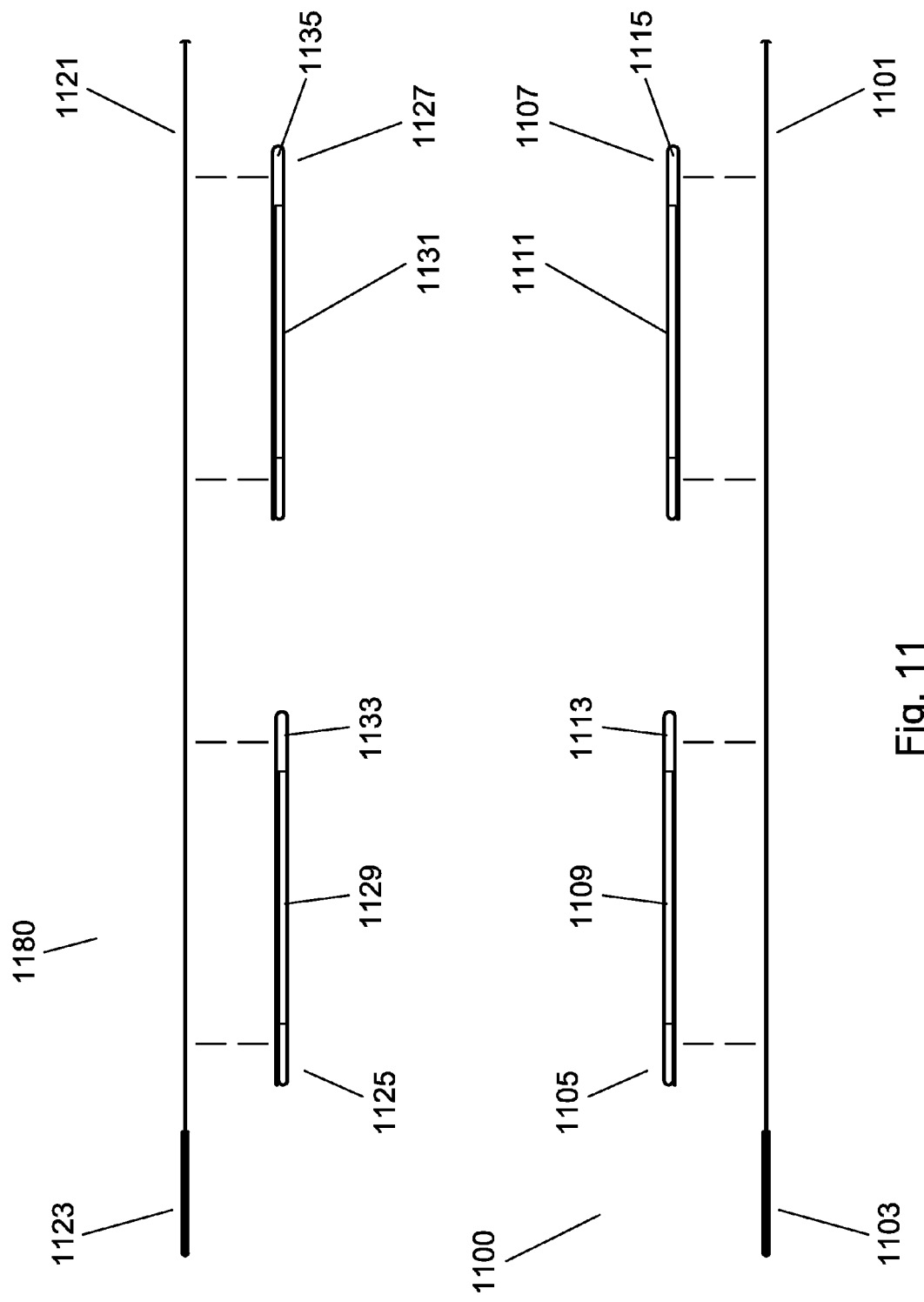
FIG. 11 is an exploded diagrammatic view of the double perimeter seal of the present invention.

Lastly, FIG. 11 is an exemplary exploded diagrammatic view of the double perimeter seal of the present invention. In the example depicted, in FIG. 11, the first perimeter enclosure magnet and the second perimeter enclosure magnet that surround the enclosure opening and the first perimeter door magnet and the second perimeter door magnet that surround the door, as seen in FIG. 6, may be constructed in a similar manner to that shown in FIG. 11. The door electromagnetic seal detail 1100 can be seen along with the enclosure electromagnetic seal detail 1180. Turning first to the door electromagnetic seal detail 1100, the door fabric 1101, as has been previously described herein, can be seen along with a door bias 1103 to prevent fraying, provide structure integrity, and the like. A first perimeter door magnet 1109 can be seen, wrapped in an outer perimeter door magnet fabric 1113 to make up a first or outer door seal assembly 1105. A second perimeter door magnet 1111 can also be seen wrapped in an inner perimeter door magnet fabric 1115 to make up a second or inner door seal assembly 1107. The second or inner door seal assembly 1107 and the first or outer door seal assembly 1105 are then stitched or otherwise fastened to the door fabric 1101 at the perimeter of the door in such as way that the first perimeter door magnet aligns with the first perimeter enclosure magnet and the second perimeter door magnet aligns with the second perimeter enclosure magnet. Turning next to the enclosure electromagnetic seal detail 1180, the enclosure fabric 1121, as has been previously described herein, can be seen along with an enclosure bias 1123 to prevent fraying, provide structure integrity, and the like. A first perimeter enclosure magnet 1129 can be seen wrapped in an outer perimeter enclosure magnet fabric 1133 to make up a first or outer enclosure seal assembly 1125. A second perimeter enclosure magnet 1131 can also be seen wrapped in an inner perimeter enclosure magnet fabric 1135 to make up a second or inner enclosure seal assembly 1127. The second or inner enclosure seal assembly 1127 and the first or outer enclosure seal assembly 1125 are then stitched or otherwise fastened to the enclosure fabric 1121 at the perimeter of the enclosure in such a way that the first perimeter door magnet aligns with the first perimeter enclosure magnet and the second perimeter door magnet aligns with the second perimeter enclosure magnet. In some embodiments of the present invention, magnets are present on three of the four sides of the door and enclosure opening, and a fourth side of the door is attached and electromagnetically continuous to, a fourth side of the enclosure opening. Various geometries of doors and enclosure openings may also be used with the double perimeter entry seal of the present invention. For clarity, stitching or other fastening techniques and materials are not shown in the drawings, but the placement of such fasteners or stitches will be clear to one skilled in the art after reviewing this specification with the attached drawings. The magnets are preferably long strips of magnetic material that can be easily sewn, encased in fabric or other material, or otherwise fastened, to the perimeter of each entry and door. An example of such a magnet is the Reane SF™ Neodymium Iron Boron magnet manufactured by The Electrodyne Company of Batavia, Ohio, and further disclosed in U.S. Pat. No. 6,707,361, the entire disclosure of which is incorporated herein by reference. The door fabric 1101 that may be used for both the enclosure body and the door of the electromagnetically shielded enclosure is a conductive material such as, for example, a metalized woven textile, a mesh, a metal, a non-woven metalized textile or metal, and the like. Other materials may also be included, such as a metal mesh for the window 113. In addition, the materials may be layered or compositely structured to accomplish additional shielding effectiveness, weather resistance, structural integrity, and the like. An example of such a metalized woven textile is a silver plated woven nylon ripstop fabric sold under the tradename ProTex Ag by Carolina Silver Technologies of Maiden, N.C. In some embodiments of the present invention, the fabric may be lire retardant or be treated with a fire retardant coating or impregnation. An example of a flame retardant coating is a dispersion of halogenated hydrocarbons and antimony, such as, for example, APEX BACKOTE #7245 by Apexical, Inc. of Spartanburg, S.C. Other coatings, such as waterproofing or weatherproofing coatings may also be applied in some embodiments of the present invention.

The electromagnetically shielded enclosure and entry seal can be constructed using standard stitching, and may also, in some embodiments, be constructed using adhesives or other fabric fastening techniques known to those skilled in the art. Thread, may be conductive metalized thread or standard non-conductive thread. The electromagnetically shielded enclosure may also be made from a single layer of fabric, or, in some embodiments of the present invention, may be made from multiple layers of fabric, or a combination thereof. For example, the front (entry side) of the electromagnetically shielded enclosure may be made from a double layer of metalized fabric, while the remainder of the enclosure may be made from a single layer of metalized fabric. The remainder of the enclosure may also be made from a double layer of metalized fabric, or further layers.

It is, therefore, apparent that there has been provided, in accordance with the various objects of the present invention, an electromagnetically shielded enclosure and double perimeter entry seal. While the various objects of this invention have been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of this specification, claims and the attached drawings.

What is claimed is:

1. An electromagnetically shielded enclosure having an entry seal where the entry seal comprises a door that in use covers an enclosure opening, the door defining a first perimeter and a second perimeter within the first perimeter, a first perimeter door magnet attached to the first perimeter of the door and a second perimeter door magnet attached to the second perimeter of the door; and an enclosure opening having a first perimeter that generally aligns with the first perimeter of the door when closed and a second perimeter within the first perimeter that generally aligns with the second perimeter of the door when closed, a first perimeter enclosure magnet attached to the first perimeter of the enclosure opening and a second perimeter enclosure magnet attached to the second perimeter of the enclosure opening where the first perimeter door magnet aligns with the first perimeter enclosure magnet and the second perimeter door magnet aligns with the second perimeter enclosure magnet to provide for electromagnetic isolation within the electromagnetically shielded enclosure.

2. The electromagnetically shielded enclosure of claim 1, further comprising a feedthrough placed through a side of the electromagnetically shielded enclosure.

3. The electromagnetically shielded enclosure of claim 2, further comprising an alignment loop.

4. The electromagnetically shielded enclosure of claim 2, wherein the door opens inwardly.

5. The electromagnetically shielded enclosure of claim 2, wherein the door opens outwardly.

6. The electromagnetically shielded enclosure of claim 2, further comprising an enclosure to frame retention assembly comprising a cord traversing a length of a fabric enclosure and at least partially wrapped in a fabric surrounding from said fabric enclosure, a slack portion of said cord being free of said fabric surrounding, wherein a retaining strap is placed through the slack portion of said cord and around a support frame for retention of a fabric enclosure to a support frame.

7. The electromagnetically shielded enclosure of claim 2, further comprising a radiofrequency shielded window.

8. The electromagnetically shielded enclosure of claim 7, further comprising a window radiofrequency seal between the radiofrequency shielded window and the enclosure.

9. An electromagnetically shielded enclosure having an entry seal where the entry seal comprises a door that in use covers an enclosure opening, the door defining a first perimeter and a second perimeter within the first perimeter, a first perimeter closure material attached to the first perimeter of the door and a second perimeter closure material attached to the second perimeter of the door; and an enclosure opening having a first perimeter that generally aligns with the first perimeter of the door when closed and a second perimeter within the first perimeter that generally aligns with the second perimeter of the door when closed, a first perimeter closure attached to the first perimeter of the enclosure opening and a second perimeter closure attached to the second perimeter of the enclosure opening where the first perimeter closure material aligns with the first perimeter closure and the second perimeter closure material aligns with the second perimeter closure to provide for electromagnetic isolation within the electromagnetically shielded enclosure.

10. The electromagnetically shielded enclosure of claim 9, wherein the closure material is conductive hook and loop fastening material.

11. The electromagnetically shielded enclosure of claim 9, wherein the closure material is a rigid flap.

12. The electromagnetically shielded enclosure of claim 9, wherein the closure material is a weight strip.

13. The electromagnetically shielded enclosure of claim 9, wherein the closure material is conductive foam.

14. The electromagnetically shielded enclosure of claim 9, wherein the closure material is a radiofrequency absorber material.

15. The electromagnetically shielded enclosure of claim 9, wherein the closure material is a magnetic strip.

16. The electromagnetically shielded enclosure of claim 9, wherein the closure material is a conductive zipper.

17. The electromagnetically shielded enclosure of claim 9, further comprising an enclosure to frame retention assembly comprising a cord traversing a length of a fabric enclosure and at least partially wrapped in a fabric surrounding from said fabric enclosure, a slack portion of said cord being free of said fabric surrounding, wherein a retaining strap is placed through the slack portion of said cord and around a support frame for retention of a fabric enclosure to a support frame.

18. The electromagnetically shielded enclosure of claim 9, further comprising a radiofrequency shielded window.

19. The electromagnetically shielded enclosure of claim 18, further comprising a window radiofrequency seal between the radiofrequency shielded window and the enclosure.

20. The electromagnetically shielded enclosure of claim 9, further comprising a feedthrough placed through a side of the electromagnetically shielded enclosure.

\* \* \* \* \*